(12) United States Patent
Ferrão De Paiva Martins et al.

(10) Patent No.: US 10,689,808 B2
(45) Date of Patent: Jun. 23, 2020

(54) PROCESS FOR USING AND PRODUCING PAPER BASED ON NATURAL CELLULOSE FIBERS, SYNTHETIC FIBERS OR MIXED FIBERS AS PHYSICAL SUPPORT AND STORING MEDIUM FOR ELECTRICAL CHARGES IN SELF-SUSTAINING FIELD-EFFECT TRANSISTORS WITH MEMORY USING ACTIVE SEMICONDUCTOR OXIDES

(75) Inventors: Rodrigo Ferrão De Paiva Martins, Charneca de Caparica (PT); Elvira Maria Correia Fortunato, Charneca de Caparica (PT); Luís Miguel Nunes Pereira, Amora (PT); Pedro Miguel Cândido Barquinha, Montijo (PT); Nuno Filipe De Oliveira Correia, Algueira/Mem Martins (PT)

(73) Assignee: FACULDADE DE CIÊNCIAS E TECNOLOGIA DA UNIVERSIDADE NOVA DE LISBOA, Caparica (PT)

( * ) Notice: Subject to any disclaimer, the term of this patent is extended or adjusted under 35 U.S.C. 154(b) by 3139 days.

(21) Appl. No.: 12/933,642

(22) PCT Filed: Mar. 20, 2009

(86) PCT No.: PCT/IB2009/005053
§ 371 (c)(1),
(2), (4) Date: Sep. 12, 2014

(87) PCT Pub. No.: WO2009/115913
PCT Pub. Date: Sep. 24, 2009

(65) Prior Publication Data
US 2015/0053360 A1 Feb. 26, 2015

(30) Foreign Application Priority Data
Mar. 20, 2008 (PT) .......................... 103999

(51) Int. Cl.
*D21H 13/02* (2006.01)
*H01L 51/05* (2006.01)
(Continued)

(52) U.S. Cl.
CPC ............. *D21H 13/02* (2013.01); *D21H 11/00* (2013.01); *H01L 51/0097* (2013.01);
(Continued)

(58) Field of Classification Search
None
See application file for complete search history.

(56) References Cited

U.S. PATENT DOCUMENTS

| 3,617,372 A | 11/1971 | McNamee, Jr. et al. |
| 4,328,133 A | 5/1982 | Ogawa et al. |

(Continued)

FOREIGN PATENT DOCUMENTS

| CA | 682814 A | 3/1964 |
| CA | 767053 A | 9/1967 |

(Continued)

OTHER PUBLICATIONS

Database; H. Sirringhaus et al.; "High-Resolution Inkjet Printing of All-Polymer Transistor Circuits"; Science, American Association for the Advancement of Science, US, Washington D.C.; Dec. 15, 2000; vol. 290; XP-001013911.

(Continued)

*Primary Examiner* — Nilufa Rahim
(74) *Attorney, Agent, or Firm* — John P. White; Cooper & Dunham LLP (57) ABSTRACT

The present invention refers to the use and creation of materials based on natural cellulose fibbers, synthetic fibbers, or mixed fibbers as physical support and storing medium or storage inducer of electrical and ionic charges in self-sustaining discrete or complementary field-effect tran-
(Continued)

sistors with non-volatile memory by using organic or inorganic active semiconductors for the manufacture of the channel regions that are deposited on the fibbers of the paper material as well as metals or passive semiconductors for manufacturing drain and source allowing the interconnection of fibbers, in addition to the gate electrode contact existing on the other side-face of the paper, p or n type respectively, in monolithic or hybrid forms.

8 Claims, 1 Drawing Sheet

(51) Int. Cl.
  *H01L 51/00* (2006.01)
  *D21H 11/00* (2006.01)
(52) U.S. Cl.
  CPC .......... *H01L 51/052* (2013.01); *Y02E 10/549* (2013.01); *Y02P 70/521* (2015.11)

(56) References Cited

U.S. PATENT DOCUMENTS

| | | |
|---|---|---|
| 2002/0158295 A1 | 10/2002 | Armgarth et al. |
| 2002/0195644 A1 | 12/2002 | Dodabalapur et al. |
| 2003/0192664 A1 | 10/2003 | Kulick et al. |
| 2004/0126935 A1 | 7/2004 | Zhang et al. |
| 2004/0249055 A1 | 12/2004 | Yeu et al. |
| 2006/0132894 A1 | 6/2006 | Schmitz et al. |
| 2006/0263953 A1 | 11/2006 | Bonfiglio |
| 2008/0014686 A1 | 1/2008 | Wang et al. |
| 2008/0038881 A1 | 2/2008 | Shin et al. |
| 2008/0054258 A1 | 3/2008 | Koenemann et al. |
| 2009/0025895 A1* | 1/2009 | Cowman ................ D21H 23/10 162/162 |
| 2011/0293851 A1* | 12/2011 | Bollstrom ............ B41M 5/5218 427/536 |

FOREIGN PATENT DOCUMENTS

| | | |
|---|---|---|
| CA | 898082 A | 4/1972 |
| CA | 922140 A1 | 3/1973 |
| JP | 2003-123559 A | 4/2003 |
| WO | 2006/104069 A1 | 10/2006 |
| WO | 2009/096802 A1 | 8/2009 |

OTHER PUBLICATIONS

International Search Report for PCT/IB2009/005053 dated Nov. 9, 2009.

* cited by examiner

PROCESS FOR USING AND PRODUCING PAPER BASED ON NATURAL CELLULOSE FIBERS, SYNTHETIC FIBERS OR MIXED FIBERS AS PHYSICAL SUPPORT AND STORING MEDIUM FOR ELECTRICAL CHARGES IN SELF-SUSTAINING FIELD-EFFECT TRANSISTORS WITH MEMORY USING ACTIVE SEMICONDUCTOR OXIDES

This application is a U.S. national phase filing under 35 U.S.C. § 371 of PCT Application No. PCT/IB2009/005053, filed Mar. 20, 2009, and claims priority under 35 U.S.C. § 119 to Portuguese patent application no. 103999, filed Mar. 20, 2008, the entireties of both of which are incorporated by reference herein.

FIELD OF THE INVENTION

The present invention refers, generally, to the use of natural cellulose fibbers, synthetic fibbers, or mixed together both physically and chemically by hydrogen bridges and resin usually designated paper in its various forms and constitutions, to function both as physical support and constituent element of n type or p type memory field effect transistors with the ability to store electrical and ionic charges for a period longer than at least 20 hours via stimulus of an electric field and delete the information when an electric field of equal intensity and opposite sign to that used for recording information is applied. That is, the use of paper as an active constituent of field-effect transistors with memory ability in which the active region of the discrete channel (1) consists of a multi-component oxide such as gallium indium zinc oxide, indium zinc oxide, zinc tin oxide, gallium tin zinc oxide, zinc nitrogen and arsenic oxides, silver oxide and alumina or copper zinc aluminium oxide and in which the components of the compounds varies between 0.1% and 99.9%, the dielectric (2) consisting of the bulk of the paper based on cellulose fibbers on which the semiconductor is deposited with the ability to immeasurably increase the retention capacity of ionic and electrical charges to a stimulus in the form of a discrete step voltage and to discharge them almost entirely (delete the information) immediately after application of an electrical stimulus with the same intensity but opposite in sign to the one used to store the information, in which the symmetrical regions of source and drain (5) consist of a metal alloy of titanium and gold or titanium and aluminium or chrome and aluminium or silver and aluminium or via a degenerate oxide semiconductor with high conductivity such as indium zinc oxide and zinc gallium oxide, or tin oxide, in constituent proportions that vary between 0.1% and 99.9%, which allow the integration of fibber containing the semiconductor where the corresponding interfaces between the layers can contain a film with nanoscale thickness for the adaptation of the same (4) and there is a continuous gate electrode (3) in which the step voltage is applied for storage or erasure of electrical charges made by any of the materials that compose the drain or source regions, but located on the other side-face of the sheet of paper.

The present invention is based on the use of cellulose-based paper consisting of cellulose fibbers chemically united by bridges of hydrogen or pressed with different thicknesses (between 1 micrometer and 8000 micrometers), simultaneously as physical support of devices and as their integral constituent element with the capacity to provide the necessary electrical insulation between a metal and an active semiconductor discretely deposited on the fibbers not allowing the movement of electrical charges through the fibber in the absence of any applied electric field, but rather the accumulation of electrical charges in its two interfaces that make a physical contact with the gate electrode (3) and channel region (3) consisting of a multi-component active oxide semiconductor discretely deposited on the fibbers, operable to keep those charges after withdrawal of the originating stimulus for a period that mediates a unit or various hundreds of hours depending on the number of existing fibbers, their distribution, degree of compaction and form a coating of their surfaces directly with the materials that respectively constitute the continuous gate electrode or discrete channel region or through a nano-layer of adaptation (4).

In the present invention for the processing of all materials to be deposited on the paper consisting of cellulose fibbers, from here onwards referred simply as paper, it is necessary that the manufacturing technologies of these films may occur at low temperatures, particularly at temperatures below 200 degrees Celsius or that when annealed, this temperature is not exceeded.

The transistors with memory effect thus produced can be used in optoelectronics and electronics particularly in the provision of electronic circuits and systems with temporary non-volatile memory, shift register recording circuits, logic circuits, digital circuits, in ring oscillators for memory rfid, among others taking the advantage that the paper is the physical support itself, being flexible and disposable.

The target devices of the present invention may use a layer of protection or encapsulation such as magnesium fluoride and can also have organic semiconductors as active semiconductor constituents of the channel region, such as N,N'-diphenyl-N,N-bis[3-methylphenyl]-1,1'biphenyl-4,4'diamine; tri-8hydroxyquinolinolate.

In this disclosure the materials to be deposited on the paper in order to form the creation of the final device can be made using physical, chemical and physicochemical reactive or non reactive deposition technical methods of thin films at an atomic scale range, held at temperatures close to room temperature, comprising namely:

cathodic sputtering of direct current or radio frequency;
resistive thermal deposition or by an electron gun, under vacuum conditions;
assisted or non-assisted chemical decomposition of vapours by radio frequency plasma or ultra high frequency;
resistive heating in vacuum;
epitaxial atomic growth;
deposition via ink-jet;
chemical emulsion.

The techniques listed allow the controlled growth of films with thicknesses between 1 nm and 50 μm of organic and inorganic materials, without damaging the paper or the electronic performance of the material deposited.

SUMMARY

The present invention describes a process of manufacturing electronic or optoelectronic device based in active oxide semiconductor field-effect transistor with non-volatile memory capability that incorporates a thin film, designated paper (2) based on natural cellulose fibbers, synthetic or mixed fibbers as the dielectric of the device.

In a preferred embodiment of the present invention, the said film (2) further acts as a substrate of the device, making it self-sustainable.

Still a more preferred embodiment of the present disclosure it has the feature to incorporate one or more additional components, of organic or inorganic origin, with electrical characteristics of a metal (3, 5), semiconductor (1), insulator (6) or of passivation films (4), in single structures, composite tandem structures or multilayer structures, deposited in a discrete or continuous fashion on both surface sides of the paper.

Another preferred embodiment of the present invention incorporates components at temperatures close to room temperature and they can be optionally annealed up to 200 degrees Celsius.

Still another preferred embodiment of this invention includes the placement of components by one or more of the following methods: by resistive thermal evaporation or by the electron gun in vacuum; direct current or radio frequency or ultra high frequency, sputtering, assisted or non-assisted by magnetron; by chemical vapour decomposition assisted or non-assisted by radio frequency or ultra high-frequency; by ink-jet printing; by emulsion chemistry.

Still another preferred embodiment of the present invention includes has the ability of depositing conductive component(s) (3, 5) comprising conductive organic or inorganic materials such as metal or oxide semiconductors of high conductivity, with thicknesses up to 30 µm.

Still a more preferred embodiment of the present invention includes depositing semiconductor component(s) (1) comprising either a covalent inorganic material, or single or multicomponent inorganic ionic material, or organic material, with a thickness between 1 nm and 50 µm, preferably silicon alloys or multi-compound zinc-based oxides.

Another preferred embodiment of the present invention comprises includes the use of ionic oxide as a degenerate semiconductor, whose function is to allow the interconnection of the fibbers coated with the active semiconductor oxide at the terminals of the channel region, and its use as drain and source regions (5), and preferably based on oxide alloys of zinc and indium.

A further embodiment of this invention includes structures based on metal electrode (3)-paper based on fibbers (2)-semiconductor (1), wherein the paper of natural or synthetic or mixed cellulosic origin functions both as dielectric and the element capable to induce and to store charges in the fibber, in the active semiconductor or in the interface between the semiconductor and the paper.

Still another preferred embodiment of the present invention provides paper of natural or synthetic or mixed cellulose origin, a layer (4) of passivation or adaptation prior to depositing any other component belonging to the final device.

Still in another preferred embodiment of the present invention the provides the passivation or adaptation to be applied to be based either on a covalent dielectric material or ionic one both of high electrical resistivity, exhibiting thicknesses in the range from 1 nm to 500 nm, more than two orders of magnitude less than the thickness of the fibbers forming the paper.

Another embodiment of the present invention has the particularity to encapsulate the final device via a dielectric (6) with a thickness up to 30 µm.

Still in another preferred embodiment of the present invention the film (2) comprises natural cellulose fibbers or synthetic fibbers produced by regeneration, dissolution or mixed techniques or mixed synthetic and natural fibbers with the ability to have spontaneous electric polarization in which the dielectric has quasi-permanent charges stored independently of any electric field applied, in a manner similar to electrets.

Still in another preferred embodiment of the present invention the cellulose fibbers of the paper (2) are embedded in a resin or ionic glue whose electro-negativity is controlled, preferably by adding cationic species such as aluminium.

This disclosure also describes an electronic or optoelectronic device based on active semiconductor field-effect transistors with non-volatile memory comprising a thin film, designated paper (2) based on natural cellulose fibbers, synthetic or mixed fibbers as the dielectric of the device.

As a further embodiment of this disclosure, the film (2) acts additionally as a substrate of the device, making it self-sustainable.

Still another preferred embodiment of the present invention further comprises one or more additional components of organic or inorganic origin, with electrical characteristics of a metal (3, 5), semiconductor (1), insulator (6) and of adaptation layer (4) in single or discrete structures, tandem compounds or multilayer structures, deposited in a discrete or continuous manner on both surface sides of the paper.

Still in another preferred embodiment of the present invention the conductor component(s) (3, 5) includes organic or inorganic conductive material, metal or semiconductor oxide of high conductivity, with thicknesses up to 30 µm.

Still in another preferred embodiment of the present invention the semiconductor component(s) (1) comprise(s) inorganic covalent material or simple inorganic ionic material or inorganic ionic compound material, or organic material, with a thickness between 1 nm and 30 µm, preferably oxides or silicon alloys or multicomponents zinc based oxides.

Still another preferred embodiment of the present invention includes ionic oxide as a degenerated semiconductor, whose function is to allow the interconnection of fibbers coated with the active semiconductor in the terminals of the channel region, and its use as regions of source and drain (5), and preferably based on oxide alloys of zinc and indium.

Still another preferred embodiment of the present invention includes structures of metallic electrode type (3)-paper composed of fibbers (2)-semiconductor (1), where the paper of natural, synthetic or mixed cellulosic origin works simultaneously as dielectric and element capable of inducing and storing charges in the fibber, in the active semiconductor or in the semiconductor-paper interface.

Still another preferred embodiment of the present invention comprises an adaptation or passivation layer (4) includes a layer (4) of adaptation or passivation deposited directly on paper (2), before depositing any other component element of the final device.

Still another preferred embodiment of this invention consists in the fact that the layer (4) of passivation or adaptation is applied in a covalent or ionic dielectric material of high electrical resistivity, particularly with thicknesses up to 500 nm, more than two orders of magnitude lower than the thickness of the fibbers forming the paper.

Still in another preferred embodiment of the present invention the final device is encapsulated by a dielectric (6) with a thickness up to 30 µm.

Still in another preferred embodiment of the present invention the devices have the form of an n or p type transistor capable of storing electrical and ionic charges along the fibbers forming the paper (2) according to their electro negativity when subject to positive or negative step voltage, respectively, applied to the gate electrode (3) and maintaining the charges loaded after disconnecting the applied gate voltage, operating in the so called floating gate mode.

Still in another preferred embodiment of the present invention the information stored along the fibbers of the paper can be completely removed or deleted with the application of a voltage of opposite signal to that used to store the information and with the same or higher intensity to the one used to store the information.

Still another preferred embodiment of the present invention has the particularity to turn the device operable to store in the same area different written information with different amplitude voltage steps, being the device able to recognize it, selectively.

Still in another preferred embodiment of the present invention the stored information can be continuously accumulated by applying step voltages of different amplitudes to the gate electrode (3), continuous or not, located on the face of the paper (2) opposite to the face containing the active semiconductor (1).

Still in another preferred embodiment of the present invention the information stored is not completely erased if the applied voltage of opposite signal has a lower value than the voltage used to write the information.

Still another preferred embodiment of the present invention provides includes on the semiconductor layer (1) of the devices, two materials deposited of high conductivity perfectly equal in terms of electronic conductivity and separated from each other by distances that can go from 10 nm to 500 μm, respectively designated the drain region and the source region (5) and allowing the interconnection of the fibbers of the paper (2) that contain the active semiconductor, oxide or non oxide based, on each side of the channel region.

Still in another preferred embodiment of the present invention, the source and drain regions include between them, a continuous organic or inorganic ionic semiconductor, with conductivities of at least three orders of magnitude higher than that of the active semiconductor material placed on the fibbers of the paper, and on which were deposited, called the channel region (1), with thicknesses depending on the thickness of fibbers of the paper containing the active semiconductor constituting the active channel region, and preferably ranging between 1 nm and 500 nm.

Still in another preferred embodiment of the present invention, the active semiconductor deposited on the fibbers of the paper is replaced by two discrete semiconductors (1, 7) of complementary electronic nature, that is p type and n type, or vice versa, juxtaposed and separated from each other by distances between 50 nm to 10 μm, forming a system called complementary device, hereafter just designated as complementary.

Still in another preferred embodiment of the present invention both semiconductors (1, 7) are connected together by respectively the same material used as drain and source, acting as common electrode and comprising two additional terminals (5) independently deposited and identical electronically in each of the ends of the channel regions, which form the interconnection between the fibbers (2) containing the respective active semiconductors (1, 7), known as source or drain or vice-versa.

Another embodiment of this invention has the additional feature of the two transistors that constitute the complimentary device never being simultaneously connected in the ON state.

Another embodiment of this disclosure provides the additional feature that the stored information is erased by applying a voltage of opposite sign and with the same intensity or amplitude used to store information in the gate electrode (3).

Still in another preferred embodiment of the present invention the said paper (2) includes natural cellulose fibbers, synthetic or mixed fibbers produced by techniques of regeneration, dissolution or mixed with the ability to have spontaneous electric polarization where it is claimed that the dielectric has quasi-permanent stored charges, independently of any applied electric field, in a manner similar to electrets.

Still in another preferred embodiment of the present invention the cellulose fibbers of the paper (2) are embedded in an ionic resin or glue whose electro-negativity is controlled, preferably by the addition of cationic species such as aluminium.

BACKGROUND OF THE INVENTION

In terms of applications the use of paper with simultaneous functions of physical support and electronic component of active devices namely field-effect non-volatile memory transistor are not known beyond their applications as support or passive dielectric in electric capacitors.

The present invention implements the use of paper of natural, synthetic or mixed cellulose origin beyond static functions or simple substrate to other active and dynamic functions thus rehabilitating paper as a high-tech solution to low cost electronic applications and, eventually, for disposable electronic applications.

This development allows providing the paper with further applicability in addition to drawing/writing in it.

In order to achieve such aspects, it is then necessary to combine dispersed technologies so that deposited material fulfills adhesion, mechanical elasticity, chemical stability, and electronic and optical quality parameters by adjusting them to 3 requirements levels: Manufacturing processes; Material and device functionality; Integration thereof in fibres, resin and glue that sustain and which form the key memory element.

In the manufacturing process, paper is prepared in order to determine the distribution of fibres embedded in resin or ionic glue whose electro-negativity is preferably controlled by adding cationic species such as aluminium and its compaction degree that determines the value of its dielectric constant and consequently the final capacity of the device wherein it will be incorporated. Moreover, during paper manufacturing process, one must control the nature of static charges stored independently from any electrical field applied emerging from the ionic nature of the resin and glue in use, which transform the set, giving it a similar feature to that of electrets as far as static charge retention is concerned.

Furthermore, it may be necessary to prepare the two surfaces of the paper in order to receive the deposits of materials needed to complete the final device. This treatment may be a simple oxygen plasma treatment on the surface of the paper, followed or not by the deposition of a small nanoscale dielectric-type film depending on the compaction capacity of the paper and charge storage effect intended.

In order to obtain the above-mentioned features, the material meant to be deposited on both paper faces will be either organic or inorganic materials with metal, semiconductor and dielectric characteristics.

The metals meant to be used and being processed by one of the aforesaid technologies (3) such as silver, aluminium, copper, titanium, gold, chromium and platinum, or any other metal alloy from the aforementioned elements or its deposition in stacked layers are used in processing of continuous or discrete electrical contacts called gate electrode or in the manufacture of drain and source regions (5) by depositing upon discrete or continuous active semiconductors used as channel layer, such as multi-compound oxide semiconductor, a film that shows resistivity in the range or less than $10^{-4}$ Ωcm. In addition to the metals it is also included, for the same function (3), or (5) any degenerated semiconductor oxides such as tin oxide, zinc oxide and indium oxide, indium doped with tin, zinc oxide doped with gallium, zinc oxide doped with aluminium with resistivity less than $10^{-3}$ Ωcm or organic semiconductor with a metal conductive characteristics as the P-dot.

The n type or p type active semiconductors used in the processing of the discrete or continuous regions of the channel (1) may be organic or inorganic ionic active materials. In terms of organic semiconductor materials are to be highlighted the following: tetracene, pentacene, copper phthalocyanine, titanium phthalocyanine oxide and phthalocyanine zinc, among others, with resistivity ranging from $10^{12}$-$10^{-4}$ Ωcm.

In the case of ionic inorganic semiconductors for use as discrete or continuous active semiconductor in the channel layer of the device, these should be mainly based on nanocomposite oxides or multi-compound oxides such as zinc oxide, tin oxide, indium oxide, titanium oxide, copper oxide, aluminium oxide, copper and aluminium oxide, nickel oxide, ruthenium oxide, cadmium oxide, tantalum, multi-compound oxides of indium and zinc, multi-compound oxides of gallium, indium and zinc, multi-compound oxides of gallium, zinc and tin, multi-compound oxides of copper and aluminium, multi-compound oxides of silver and copper, multi-compound oxides of titanium, multicomponent oxides of indium and gallium, multicomponent oxides of tin and gallium, multicomponent oxides of copper, zinc, tin and silver, whatever the percentages of compositions of the elements of which may vary among themselves by 0.1% and 99.9% with resistivity ranging between $10^{14}$-$10^{-4}$Ω and thicknesses, which can be up to 500 nm.

In terms of materials of very high resistivity used as material for passivation of the interfaces or adaptation between materials to deposit and fibbers' (4) they are essentially oxides or nitride-based compounds with thicknesses between 1 nm and 1000 nm such as silicon dioxide or silicon nitride, or magnesium fluoride, or mixtures of hafnia and alumina or silicon dioxide, or organic material or another single or multilayer material, such as tantalum oxide, hafnia, zirconia, yttria, alumina or oxide compounds such as hafnium/tantalum oxide, alumina/tantalum oxide, hafnia/alumina; silicon dioxide/tantalum pentoxide, tantalum yttrium; zirconium/tantalum pentoxide/silicon dioxide, alumina/titanium oxide or PMMA, or POMA, or mylar, all processed at temperatures ranging from −20 degrees Celsius to 200 degrees Celsius, intending that in addition to highly compact and extremely flat surfaces, the structures of the materials are amorphous or nano-structured.

The selection of the most adequate material or materials will depend on the time required to store charges and whether these show the desired operating efficiency towards the material forming the channel, so as to achieve the desired electrical insulation and wherein the spatial definition and geometry of said device constituent is carried out using a standard lithography technique, or by mask or lithographic technique known as lift-off.

Figure 2:
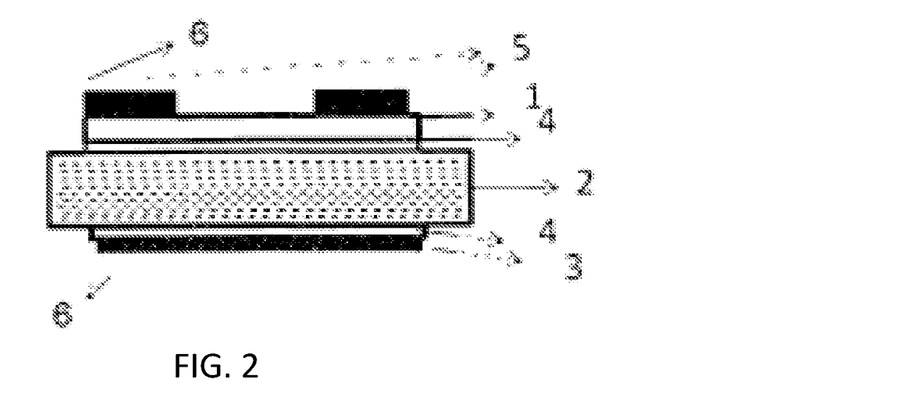
FIG. 2 is a schematic view of a type n or p junction field-effect transistor with non-volatile memory effect with or without the adaptation layer of deposited materials and both surfaces of the paper used as a dielectric with memory effect and wherein the drain and source regions are deposited on the active semiconductor deposited on the fibbers and which promotes the integration and connection of different fibbers, according to the figure caption.

In terms of devices, it is intended to:
1. Manufacture Metal Insulator Semiconductor (MIS) structures such as capacitors with the ability to store electrical charges during times that mediate between one hour and hundreds of hours and wherein the insulation/inductive material of the process of electrical charges storage and simultaneously support of the device is a sheet of paper composed of discrete fibbers' containing the metal like gate electrode (3) on one side of the paper surface and on the other side the active organic or inorganic semiconductor deposited using any of the technologies mentioned above ((1), (2), (3), (3));
2. manufacture of n and p types field-effect transistors with non-volatile memory effect (FIGS. 3 to 5) wherein the dielectric and storage medium or charges storage inductor is the paper that is composed of layers of fibbers distributed along different layers mechanically compact and connected by resins and adhesives (2); the active semiconductor forming the channel region is an ionic inorganic semiconductor or an organic semiconductor (1) discretely deposited on the fibre surface and the source and drain regions are respectively based on a highly conductive oxide or on a metal or a highly conductive organic semiconductor (4) through which integration is made. These devices are composed as shown in FIG. 2, wherein the channel (1) is directly deposited on the paper composed by agglomerating fibres (2) or on an adaptation layer of interfaces previously deposited on the paper (4) together with films forming the source and drain regions (5) and on the other face of the paper (2) the continuous gate electrode (3) is deposited either the continuous or discrete gate electrode (3) directly or by means of an adaptation layer consisting of a metal or highly conductive oxide or highly conductive organic material such as tetracene, pentacene, copper phthalocyanine, titanium phthalocyanine oxide and zinc phthalocyanine, among others. These devices have mobilities exceeding 0.5 $cm^2V^{-1}s^{-1}$, on/off ratios above or equal to $10^4$, storage periods exceeding one hour, positive operational voltage threshold for n type transistors and negative operational voltage for p type transistors and to operate in either on enhancement mode or depletion mode, and to be encapsulated or not (6). That is, in order to be in the ON state a voltage needs to be applied unless the device is already in the ON state without application of any voltage. In these devices the writing of information (retention of electrical charges due to electrons or negative ions close to the gate electrode or near the channel region, which is a function of the type of semiconductor of the channel, respectively p type or n type, as well as on the nature of the resin used) is made by applying an absolute amplitude voltage higher than the threshold operational voltage of the device, the amount of stored charges being proportional to the value of the applied voltage that varies on a continuous manner between a minimum value equal to the threshold voltage and a maximum voltage corresponding to the electrical region of the transfer characteristic of the device where the drain current in the channel region saturates and therefore, the maximum of induced and accumulated charges (both, electrons and ionic charges) by the device. To delete all the stored information (translated into stored electrical and ionic charges), it is necessary to apply a voltage of equal magnitude but opposite in sign to the voltage used to write (store charges) the information. This will allow storing and writing in the same space of distinct information by using different step voltages or applying gate voltages that the device is able to recognize in a selective manner.

Figure 3:
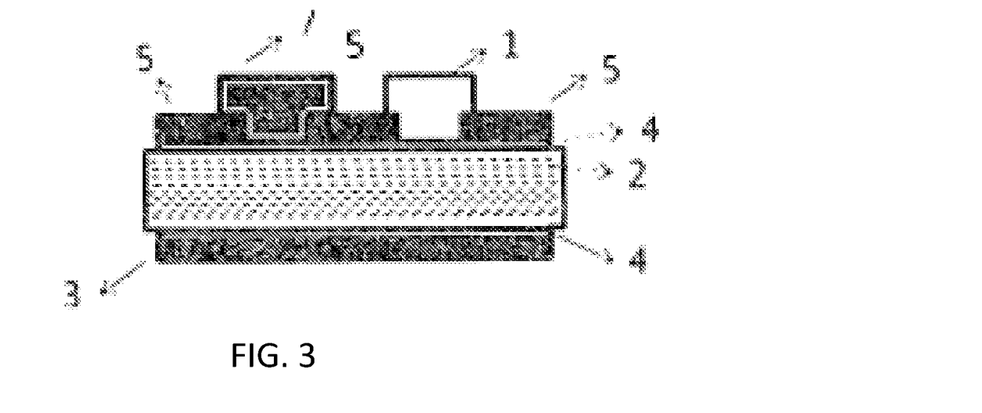
FIG. 3 is a schematic view of a non-encapsulated field-effect CMOS device with non-volatile memory effect comprising adaptation layers between the deposited materials and both surfaces of the paper used as dielectric and wherein the active p and n semiconductors or vice versa overlap the drain and source regions, according to the figure caption.

3. manufacture CMOS or C-MESFET type devices with non-volatile memory ability in which the material used both as substrate and dielectric with the ability to store or to induce the storage of electrical and ionic charges is the paper composed of discrete fibbers and wherein the complementary n type and p type semiconductors incorporated in the device will either be inorganic ionic semiconductor or organic semiconductors, or any of its possible hybrid combinations deposited on the fibbers forming the paper as shown in FIG. 6. That is, a device based on two field-effect transistors, one of a p type other of n type with a common gate and wherein at the output terminals (source and drain or vice versa) is common and the other two output terminals are independent and that with the application of a positive voltage the n type transistor (1) is in ON state and writing while the p type transistor (7) is on OFF state deleting the information, the reverse happening when applying a negative voltage.

The present invention intends to generate a new concept for the application of the cellulose-based paper and new ionic inorganic semiconductors and organic semiconductors, or by the combination of both semiconductors designated by the hybrid form for applications of non-volatile memory in which any patent is unknown in the state of the art or the features. In other words, it refers to a structure of MIS capacitors for application in non-volatile memory or field-effect transistors with non-volatile memory effect or CMOS devices with non-volatile memory effect wherein the paper is both the support and active element promoting charge storage and their combinations with inorganic semiconductors, based on multi-compound oxides, or organic semiconductors or the combination of both semiconductors.

The research made in several patent records databases showed that none of the processes, products and systems functionality of the paper which is subjects in the present disclosure were published or submitted for patent.

The concept behind the present invention is new and, although its embodiments are sustained by known technologies, its novelty lies within the scope of a new set of purposes.

BACKGROUND OF THE INVENTION

The state of the art of the present invention, as well as patent documents prior to the present disclosure, that might be related thereto, will be hereinafter described.

In terms of industry, design or application, any activity related or corresponding to the subject of the present disclosure is unknown, in its aspects of integrated process, products and systems.

The research undertaken resulted in the following patents and prior art references, although not considering the use of a cellulose support for simultaneous functioning of substrate and electronic component presenting memory effects.

1. The national patent application No. 103951 filed in 2008 refers to the use of cellulose-based or bio-organic paper as a physical support for the processing of electronic devices and systems and not to its integration in manufacturing and supporting of the electronic devices and systems with memory effect. Therefore, in national patent 103951, paper is a simple physical support of electronic devices that are produced by any conventional technology using covalent semiconductor or organic and inorganic ionic semiconductors, comprising respective metal connections. The only point of convergence of the present invention to the previously mentioned invention is that the devices are based on the same material processing technologies. On the other hand, the memory effect claimed in national patent No. 103951 refers to electrochromic materials which are deposited on the paper and maintain their oxidation state (oxidized or reduced) after withdrawing the electrical stimulus that originated them. This effect is reversible. This memory effect has nothing to do with the present invention wherein the non-volatile memory effect is associated with an intrinsic characteristic in the paper and with the innovation associated with creating new electronic devices based on different cellulose fibber integration on which active semiconductors are deposited and whose surface integration is carried out by means of contact with metal features that allow interconnecting all fibbers and respective active semiconductors in the same face of the paper and wherein the control allowing the induction of charges is based on a continuous gate electrode deposited on the other face of the paper on which an electrical step pulse is applied which allows writing, reading, re-writing or deleting the information stored and collected in the set of fibbers thus resulting in the existence or inexistence of current circulating in the channel region formed by the active semiconductor.

2. U.S. Pat. No. 3,617,372 filed in 1969, refers to electroconductive paper for producing electrostatic images, wherein action takes place in the manufacture region of paper in volume, allowing it to contain polymer chains from hydroxyethyl and hydroxypropyl group in order to adequate paper to image capture functions, and provide non contact printing. The patent is not in force. It was related to the paper in volume constituent in image capture and recording not being related whatsoever to aspects of the present invention.

3. Japanese Patent JP2003123559, "Forming method and its device for transparent conductive film, transparent conductive film and electronic paper"—aims the production of transparent and conductive films at low temperatures, named Indium Tin Oxide, ITO (or zinc oxide, ZnO), via chemical vapour decomposition assisted by a plasma using gaseous forms of indium iodide and tin chloride (zinc nitrate ($Zn(NO_3)2.6H2O$)) in an oxygen atmosphere, with or without an inert gas such as Argon, deposited on polythiophene polymer membranes or other organic-based material, in order to use in the so-called electronic paper (e-paper). That is, the possibility to rewrite alphanumeric characters or images on a flexible film based on a transparent conductive oxide deposited on an organic substrate. In this case, for example, the transparent conductive oxide is intended to serve as an electrode for the application of electrical fields to control image hue, for example those formed from the orientation of liquid crystals. This patent is about a process for obtaining films, system thereof, and physical-mechanical characteristics of the films thus obtained, such as adhesion. That is, an aspect of the invention is to provide the production of organic substrates of conductive oxides to be simply used as electrodes, not comprising in the patent the use of cellulose-based paper, simultaneously, as electronic component with memory capability and the support of the device that incorporates.

4. U.S. patent U.S. 2006/0132894—discloses the deposition of transparent conductive oxides on both faces of the electronic paper having as main target applications similar to those described in JP2003123559. In other words, it is directed to adaptation technologies used in displays namely liquid crystal for new flexible displays produced on organic media. Thus, the claims of this patent are included in the scope of equipments used and of how to process and retain an image on organic flexible substrates, comprising the control of non conductive particles placed within the paper itself or under the oxides produced, with the capability to change their degree of transmittance by applying an electrical field. This is not within the scope of the present disclosure.
5. Canadian patent CA682814 "Electrically conductive paper, and method of making it"—relates to the volume processing of conductive paper, in particular to the inclusion of conductive fibres in its volume coated or not by metal, randomly dispersed in a cellulose matrix. This is not within the scope of the present disclosure, which does not include manipulating the paper structure.
6. U.S. Patent US2003/0192664A1 "Use of vinyl amine polymers with ionic, cross-linked Polymeric microbeads in paper making" refers to a method of paper manufacture and its constituents, namely in the use of organic ionic additives to facilitate fluid drainage and retention in the paper. This patent not within the scope of the present disclosure.
7. The U.S. Patent US2004/0249055A1, "Paper coating latex using ionic monomer" refers to a paper coating containing co-polymer ionic monomers or the inclusion of the said monomers in the paper volume in order to optimize the fluid stability and retention features, not being within the scope of the present invention.
8. The Canadian patent CA767053 "Electrically conductive paper"—refers to coating of cellulosic paper in conductive volume, coated with an insulation photoconductor material, associated with the incorporation of zeolites, able to ensure a resistivity inferior to $10^{12}$ Ωcm, aiming for the development and maintenance of electrostatic charges for information printing. This is not within the scope of the present disclosure wherein the paper is intended to function as a dielectric capable of storing charge loads and simultaneously serve as support element to the various components forming the device on both faces of the paper.
9. Canadian patent CA898082 "Polymeric quaternary derivatives of 4-vinyl pyridine in electrically conductive paper"—refers to the use the quaternary polymers capable of receiving photoconductor coatings capable of producing electrostatic copying paper. This is not the scope of the present invention.
10. Canadian patent CA922140 "Electro-conductive paper"—deals with the electro-conductive paper with polymers with at least 75% of its constitution useful in the techniques for image reproduction. The patent protects all compositions containing radical structures of the type:

This is not the scope of the present invention.

From de above-description, one might conclude that in terms of the product and method disclosed in the present invention, no publication or patent application related thereto.

The patents and references mentioned correspond to the state of the art wherein the present disclosure might be found, there being some peripheral points in common, in terms of process and materials used as conductors, on plasticized surfaces and the processes take place in some cases at room temperature. However, the existence of work and patents or patent applications that focus on using cellulose-based paper simultaneously as a component in active devices with memory effect and physical core of these devices, their derivatives or compounds are unknown.

The present invention consists of integrating different technologies, seeking the creation of self-sustainable field-effect electronic devices with non-volatile memory effect consisting of cellulose paper, its compounds or derivatives that determine the final functionality of these products and systems with the ability to electrically isolate a gate electrode consisting of a film with metallic characteristics to which the control voltage is applied or to which information from another semiconductor electrode is written being designated channel where charges are induced and others are trapped on the coated fibers with the active semiconductor, such as ionic charge, to be retained or withdrawn and where their circulation emerges from the polarization on two symmetrical terminals designated source and drain respectively, being deposited upon the edges of the channel length of the later semiconductor and wherein the deletion of stored information requires applying a voltage presenting the same absolute value but opposite signal to that which provides the device with a selectivity ability concerning writing or erasing information. The manufacture of such devices, whether in lab performance or attempt, is unknown. This is the central aspect of the present invention, from which a hybrid device emerges that produces new effects and adds a new value in the application of the disclosure, which is not present in the state of the art of existing systems.

BRIEF DESCRIPTION OF THE DRAWINGS

FIG. 1 is a schematic view of the basic structure of a non-encapsulated condenser consisting of Metal, Insulator and Semiconductor or designated MIS condenser according to the figure caption:
1. p or n type organic or inorganic ionic active semiconductor to deposit on the fibbers;
2. natural or synthetic cellulose-based paper or combinations thereof chemically (resin and glue) or mechanically linked together operating both as charge storage discrete dielectric and as physical support for the electronic component;
3. Gate electrode operating as continuous electrical contact, also serving as an electrode made of a metal or metal alloy or of successive deposition of two metals or a high conductivity semiconductor oxide or a high conductivity organic material.
4. Interface passivation or adaptation layer existing in one or both interfaces in the paper.

5—drain and source Region of junction field-effect transistor consisting of a high conductivity organic semiconductor such as the P-dot or a metal or a high conductivity semiconductor oxide in the single, composite or multi-compound forms.

6—Encapsulation Layer, surface passivation.

7—Channel region whose semiconductor type is complementary to semiconductor channel corresponding to figure caption 1 which being of the n type, the complementary shall be of the p type and vice-versa.

DETAILED DESCRIPTION OF THE PREFERRED IMPLEMENTATION OF THE PRESENT INVENTION

The present invention provides the use of cellulose-based paper or cellulose compounds with different grammage and compositions in the creation of non-volatile memories wherein the paper and its fibbers act simultaneously as physical support for singular or integrated electronic and optoelectronic devices and as a dielectric able to store or induce electrical and ionic charges in field-effect devices based on multi-compound semiconductor oxides or organic semiconductors in single or hybrid form for manufacturing the gate electrode, channel region, discrete drain and source regions of p or n type devices or in a complementary form of p and n type operating in enhancement or depletion modes and adapting compatible procedures to the present process, so as not to damage the paper to the remaining constituents of the non-electronic memory. To this end, all processes take place at temperatures below 200° C., especially those occurring on the paper surface being also obtainable at temperatures as low as −20° C.

According to the aforementioned, the present disclosure proposes a set of functions and techniques which, by means of new innovative processes, enable new products and systems involving paper both as physical support and as an electronic component capable of retaining or inducing electrical charge storage in single or complementary p type or n type field-effect devices with non-volatile memory effect. That is, the complementary device consists in using simultaneously two devices, one of being of the p type and the other of the n type, both operating under the influence of the same gate electrode but with different channel regions (one being based on a p type semiconductor and the other based on a n type semiconductor) and common source and drain regions or vice versa and a separate source and drain, associated to each region, and presenting dimensions of up to 925 µm.

A—MIS Capacitor Presenting Electrical Charge Storage Ability

Figure 1:
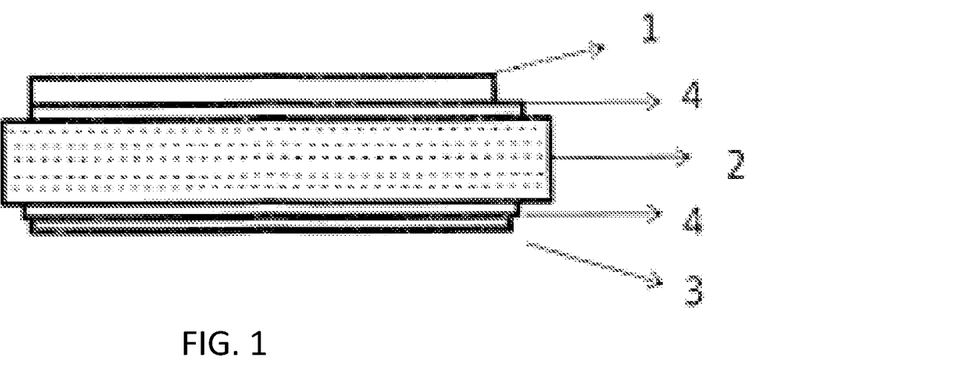

FIG. 1 illustrates a Metal Insulator Semiconductor-type capacitor, designated MIS structure wherein the interfaces of both paper surfaces (2) might or might not be passivated by specific treatment in oxygen plasma or by deposition of a highly insulating film with dimensions in nanometre range (4) scope. In FIG. 1, the gate electrode (3) can be a continuous or not metal- or metal alloy-based on degenerate semiconductor oxides. Whatever the case, the active semiconductor may be an organic or inorganic ionic semiconductor (1) deposited on the fibbers forming the paper. Any component forming the device can be manufactured by conventional physical, chemical or physical-chemical deposition techniques, such as the ones to be below described.

The operation principle of the device is based on the so-called field effect wherein collected charges and/or stored along the fibbers and surrounding resins depend on how the fibbers are associated along the layers building the thickness of the paper; the electro-negativity of the paper and the electrical field applied to the gate electrode. The voltage required to store the information (electrical charges) is higher than the minimum voltage required for inducing electrical charges through the paper to the active semiconductor, this value ranging from 0.2 Volts to 100 Volts, depending essentially on the thickness of the paper and compaction degree of cellulose fibbers. The storage or retention times of the electrical charges can vary from 30 minutes to hundreds of hours, according to the electrical field applied, thickness of the paper, number of cellulose fibres forming the paper, semiconductor resistivity, electro-negativity of the fibres, static ionic charges present in the paper and whether the surface finishing have been passivated and the device has been submitted or not to encapsulation.

B—Process for Manufacturing MIS Capacitor Presenting Electrical Charge Storage Ability As a first step, regardless of paper type and grammage used, it is necessary to prepare and to condition the surface, taking its texture and intention to manufacture continuous films into account. This is achieved by means of:

a) Either by treating, both paper surfaces through UV for 10 minutes;

b) Or by subjecting both paper surfaces to a radiofrequency plasma or direct current plasma in oxygen, argon or nitrogen or xenon atmosphere or nitrogen and hydrogen atmosphere up to 95:5 ratios and at pressures ranging $1\text{-}10^{-2}$ Pa, for 5-15 minutes using power densities between 0.01-3 $Wcm^{-2}$;

c) Or by depositing a passivation thin film—which may be a ceramic or nanocomposite or multicompound film, oxidized or nitro compound—with a thickness ranging from 2-200 nm;

d) Or by cleaning the surface with a nitrogen/hydrogen jet flow, in order to withdraw free nanoparticles and activate the surface (this being the function of hydrogen when mixed with nitrogen).

Once the paper or substrate surface has been prepared, it is transferred to the environment where the various stages will be performed, according to the purpose intended.

i) For processing the metal electrode, shown in FIG. 1 with the reference number (3) it consists of a deposit of an inorganic metal material or conductive oxide or organic material such as P-dot with electrical resistivity below to $10^{-3}$ Ωcm produced by any technique so as to form a continuous film as follows:

I) Resistive vacuum thermal evaporation, or by electron gun thermal evaporation using a vacuum atmosphere below $10^{-3}$ Pa and systems wherein the substrate temperature is controlled by cooling from −20° C. to 200° C. The minimum thickness to be used is of about 10 nm. This process can be implemented and carried out continuously (roll to roll) and the distances between the substrate and heated filament depends on the size of the sheet of paper intended to use, ranging preferably from 25 cm to 50 cm.

II) Magnetron-assisted cathodic sputtering (direct current or radio frequency or ultra high radio frequency designated respectively by DC, RF or UHF), under argon atmosphere, either with or without the addition of oxygen during the manufacturing process and wherein the substrate temperature is controlled (cooling) under a vacuum pressure from 1 Pa to $10^{-1}$ Pa and wherein the metal target substrate distances vary from 5 cm to 15 cm, depending on the dimensions of the target intended to use and the size of the paper intended to deposit.

III) The ink-jet printing from a chemical solution containing organic or inorganic components intended to deposit and wherein the minimum thickness of materials deposited is of 10 nm.

IV) by rapid spread of chemical emulsion of a chemical solution containing the elements intended to deposit with thicknesses up to 400 nm.

ii) For processing the organic or inorganic ionic active semiconductor referred to with reference number 1 in FIGS. 1 and 2 and intended to deposit on the fibbers forming the paper by means of one of the following techniques:

V) Magnetron-assisted cathodic sputtering (DC or RF or UHF) under reactive oxidizing atmosphere and metallic or ceramic substrates, with different compositions and purity grades. The vacuum pressure to be used may range from 1 Pa to $10^{-1}$ Pa; and wherein the target substrate distances range from 5 cm to 15 cm, depending on the dimensions of the target to be used and the dimensions of the sheet of paper intended to deposit. The thickness is of about 1 nm-500 nm.

VI) Vacuum thermal evaporation, either resistive or by electron gun, from ceramic/oxides containing metal elements to be deposited and whose process is carried out at vacuum pressures below $10^{-3}$ Pa, following the procedures previously described for this technique.

VII) Assisted chemical vapour decomposition by radio frequency plasma or UHF. In this case, the elements to be deposited are gaseous, process using vacuum pressures of 10-200 Pa, power densities between 0.03-2 $Wcm^{-2}$ and excitation frequency between 13.56 MHz and 60 MHz. The useful thickness for the active semiconductor are of about 10-800 nm.

VII) Ink-jet printing from a chemical solution containing organic or inorganic components, wherein the minimum thickness of deposited materials is of 1 nm-500 nm.

IX) By rapid spread of a chemical solution containing elements to be deposited and wherein the thickness of the deposited materials is of 1-500 nm.

iii) For processing of the adaptation layer referred to in FIG. 1 with reference number 4 or the encapsulation layer referred to as 6, the manufacturing process to be used is that of item ii), using the same type of material but now with electrical resistivity of at least 3 orders of magnitude higher than that of any active semiconductor.

C—Processing and Creation of Junction Field-Effect Transistors with Non-Volatile Memory Effect The present section discloses the processing of n or p type junction field-effect transistors with non-volatile memory effect encapsulated or non-encapsulated with or without adaptation layer at the paper interfaces as shown in FIG. 2 by means of an example operating in enhancement or depletion mode, that is, depending on whether a voltage is applied or not to the gate electrode so that they might be able to be in the switching ON stated or information writing mode. The function of the paper associated with the field-effect device is to guarantee the necessary electrical insulation required for the induction process of electrical charges on the semiconductor paper interface and to store them or retain charges in the absence of any gate voltage applied until another voltage of equal amplitude but of opposite signal is again applied to the gate electrode. Should another voltage be applied, which is not adequate to delete the stored information, either the process of electrical charges accumulation increases (if to the gate electrode is applied voltages of the same signal of that which is used to store the information, either of higher or lower intensity) or decreases (if to the gate electrode is applied voltages of opposite signal from that which is used to store electrical charges, but now the absolute value being inferior to the voltage intensity applied to the gate electrode to store electrical charges) or ceases to exist (if to the gate electrode is applied voltages of opposite signal from that which is used to store electrical charges, but now the absolute value being equal or higher than that of the voltage applied to the gate electrode used to store electrical charges). FIG. 2 is a schematic view of a junction field-effect transistor with non-volatile memory effect wherein the fibbers are distributed by various layers and submerged into a resin and glue, and wherein the passivation or adaptation of interfaces is also included.

The materials to be used as active ionic p type or n type semiconductor for processing the channel region to be deposited on the fibres, referred as reference number 1 in FIG. 2 are essentially multi-compounds such as zinc oxide, zinc oxide bound to aluminium, tin oxide bound to fluoride, or copper oxide, or cadmium oxide or silver oxide, or compound alloys of indium molybdenum, or compound alloys of tin and indium, or compound alloys of indium and zinc, or compound alloys of zinc and gallium, or compound alloys of indium zinc and gallium, or compound alloys of indium zinc and silver, or compound alloys of indium zinc and zirconium, or compound alloys of indium zinc and copper, or compound alloys of indium zinc and cadmium, or compound alloys of indium zinc and tin or compound alloys of gallium zinc and tin, or compound alloys of indium zinc and molybdenum, or compound alloys of hafnium or titanium or alumina or tantalum oxide and in compositions that may vary from 0.1% to 99.9% of its constituents, showing resistivity from $10^{11}$-$10^0$ $\Omega cm$, depending on the composition and partial oxygen pressure used during the manufacturing process. The technologies to be used are all described in A ii). The useful thickness of channel regions range 1-500 nm and are well below those of the fibbers forming the paper, at least by one order of magnitude.

For processing the source and drain regions of referenced as 5 in FIG. 2, separated from each other between 10 nm to 500 μm, the same semiconductor previously mentioned are used but now presenting a lower resistivity from 5-$10^{-6}$ $\Omega cm$, or metals with metal alloys or multilayer or stacked structures, involving the following materials: titanium, aluminium, gold, silver, chromium, or molybdenum showing resistivity lower than 5 $\Omega cm$, using the same technologies allowing the interconnection and connection of fibres containing the active semiconductor. The useful thickness of drain and source regions range from 1 nm-30000 nm depending on whether the integration into a single fibber or the integration and connection of various fibbers containing the active semiconductor in the same layer is intended.

The adaptation or passivation or encapsulation layers to be used are the same as those mentioned in A.

D—Processing Non-Volatile CMOS Memory Devices

The present example provides for the simultaneous use of two junction field-effect transistors, one n type operating in enhancement mode, as shown in reference number (1) in FIG. 3, and the other being of a p type transistor operating as dynamic charge also in enhancement mode, or a n type transistor operating in depletion mode as indicated by reference number (7), manufactured according to the previously described, with or without passivation layer of one or either paper surface sides, which corresponds to the manufacture of a device designated non-volatile memory CMOS device. In this type of circuit both transistors are never simultaneously actuated, allowing its use in the design of digital circuits and design of logic gates with the ability to store electrical charges. The manufacturing process to be used and the thickness of its various constituents are the same as those mentioned for the case of manufacturing junction field-effect transistors with non-volatile memory effect.

It should be clear that the embodiments of the present devices and semiconductor circuits and applications thereof described above, are simply possible implementation examples merely set to a clear understanding of the principles of the disclosure involving the creation of new devices with new memory functions in which the paper fibbers constitute its main component. Variations and modifications can be made to the above embodiments without substantially deviating from the spirit and principles of the invention. All such modifications and variations must be included within the scope of this disclosure and present invention and be protected by the claims of the disclosure.

Implementations

The main industries that currently might come to use the devices and integrated circuits resulting from the use of the present invention innovation are the entire electronics industry, the semiconductor industry, the memory industry and similar industries, the logic circuits industry, the instrumentation and sensors industry, the medical and biotechnology industry, the optoelectronics, the micro and nanoelectronics industry. The devices based on this invention are designed for direct application in all electronic based on field-effect devices with memory effect, and it may include circuits of information conduction and storage (record shift register, dynamic RAM), design of logic circuits, namely the buffer and counter type circuits; capacitors presenting high charge retention capacity among others.

The present invention aims for developing and creating a product or products using simple and cost-effective processing techniques, which involves the use of processing techniques that stay in line with the processing of thin films on both sides of the cellulose-based paper at low temperatures leading to the creation of paper-e thus resulting in the green electronics of the future.

On the other hand, the required manufacture technological processes are compatible to those existing in electronics industry, optoelectronics industry, the semiconductor industry, namely those processes of large area cathodic sputtering, or thermal evaporation or sol-gel or ink-jet, hence no need for high investments in terms of research and matching technology.

The technical advantages provided by the present invention allow the active use of paper in a dynamic way, not only in a static way, serving so simultaneously as a substrate and active component of the electronic devices with non-volatile memory that are produced upon it.

Although the preferred embodiment has been described in detail, it should be understood that many variations, substitutions and changes may be made without departing from the scope of this invention, even though all advantages identified above are not present. The achievements presented herein illustrate the present disclosure that can be implemented and incorporated into a variety of different method fashions, which fall under the same scope. Moreover, the techniques, constructions, elements, and processes described and illustrated in the preferred embodiment as distinct or separate, may be combined or integrated with others techniques, constructions, elements, or processes, without departing from the scope of this invention. Although the present invention has been described in several embodiments, these may still be modified according to the scope of application of the present invention. Other examples of variations, substitutions, and alterations are easily determined by those skilled in the art and could be implemented without departing from the spirit and scope of the present invention.

The invention claimed is:

1. A field-effect semiconductor active electronic or optoelectronic device comprising a non-volatile memory which comprises:
    (a) a paper as dielectric and charge storage, which comprises natural cellulose-based fibres, synthetic fibres or combinations thereof, wherein said natural cellulose-based fibres, synthetic fibres or combinations thereof are discrete, are embedded in a resin or ionic glue, and are coupled chemically or mechanically, in said dielectric; and
    (b) an active semiconductor layer applied on said natural cellulose-based fibres, synthetic fibres or combinations thereof forming said paper, the active semiconductor layer being at least ten times thinner than said paper comprising said natural cellulose-based fibres, synthetic fibres or combinations thereof.

2. The device according to claim 1 wherein an electronegativity and dielectric constants of said paper are manipulated by:
    using spontaneous electrical polarization of said natural cellulose-based fibres, synthetic fibres or combinations thereof;
    incorporating static ionic electrical charges by means of the resin or glue;
    incorporating aluminium cationic species;
    controlling its compaction; or
    a combination thereof.

3. The device according to claim 1 wherein said natural cellulose-based fibres or synthetic fibres are bonded in layers by using one or more adhesives.

4. The device according to claim 1 wherein said natural cellulose-based fibres or synthetic fibres are bonded in layers by mechanic compression.

5. The device according to claim 1 wherein said paper further acts as a substrate of said device turning it into a self-sustainable device.

6. The device according to claim 1, wherein a thickness of the paper is above 10 microns.

7. The device according to claim 1, wherein its memory operation is continuously accumulated by applying voltages, negative or positive, presenting different amplitudes from a gate electrode, which is placed at the opposite paper face to that containing the active semiconductor, and its memory retention is operated by not applying these voltages, thus operating in floating gate mode.

8. A complementary pair device comprising at least one pair of two field-effect semiconductor active electronic or optoelectronic devices of complementary p and n types, respectively, each of the two field-effect semiconductor active electronic or optoelectronic devices being constituted like the device according to claim 1.

* * * * *